(12) United States Patent
Wang

(10) Patent No.: US 11,522,119 B2
(45) Date of Patent: Dec. 6, 2022

(54) PIEZOELECTRIC ACTUATOR

(71) Applicant: Brother Kogyo Kabushiki Kaisha, Nagoya (JP)

(72) Inventor: Rui Wang, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 280 days.

(21) Appl. No.: 16/835,802

(22) Filed: Mar. 31, 2020

(65) Prior Publication Data

US 2020/0313065 A1 Oct. 1, 2020

(30) Foreign Application Priority Data

Apr. 1, 2019 (JP) .............................. JP2019-069584
Mar. 3, 2020 (JP) .............................. JP2020-035590

(51) Int. Cl.
*H01L 41/047* (2006.01)
*H01L 41/09* (2006.01)
*H01L 41/083* (2006.01)

(52) U.S. Cl.
CPC .......... *H01L 41/047* (2013.01); *H01L 41/083* (2013.01); *H01L 41/0986* (2013.01)

(58) Field of Classification Search
CPC . H01L 41/047; H01L 41/083; H01L 41/0986; H01L 41/0475; H01L 41/0973; H01L 41/00–0536; H01L 41/08–1138; H01L 27/20; H01L 41/29–297
See application file for complete search history.

(56) References Cited

U.S. PATENT DOCUMENTS

| 8,585,188 | B2 | 11/2013 | Ohta | |
| 10,207,496 | B2* | 2/2019 | Yamashita | .......... H01L 23/5286 |
| 10,363,741 | B2* | 7/2019 | Tanaka | ................ H01L 41/0973 |
| 2010/0231659 | A1 | 9/2010 | Ohta | |
| 2013/0050353 | A1 | 2/2013 | Ohta | |
| 2018/0104952 | A1* | 4/2018 | Naito | ................... B41J 2/14072 |
| 2018/0226563 | A1* | 8/2018 | Kijima | ................. H01L 41/053 |
| 2020/0313073 | A1* | 10/2020 | Wang | ................... B81B 7/0025 |

FOREIGN PATENT DOCUMENTS

| JP | 2010-214634 A | 9/2010 |
| JP | 2010-241080 A | 10/2010 |
| JP | 2013-256138 A | 12/2013 |

* cited by examiner

*Primary Examiner* — Shahed Ahmed
(74) *Attorney, Agent, or Firm* — Banner & Witcoff, Ltd.

(57) ABSTRACT

A piezoelectric actuator includes a first electrode, a first piezoelectric body disposed at one side of the first electrode in a thickness direction of the first electrode, an individual electrode disposed at one side of the first piezoelectric body in the thickness direction, a second piezoelectric body disposed at one side of the individual electrode in the thickness direction, a second electrode disposed at one side of the second piezoelectric body in the thickness direction, a wiring that electrically connects to the individual electrode, a first contact, and a second contact. At the first and the second contacts, the first electrode and the second electrode electrically connect to each other. The first contact is disposed at one side of the individual electrode in a perpendicular direction perpendicular to the thickness direction. The second contact is disposed at the other side of the individual electrode in the perpendicular direction.

13 Claims, 10 Drawing Sheets

PIEZOELECTRIC ACTUATOR

CROSS-REFERENCE TO RELATED APPLICATION

This application claims priority from Japanese Patent Application No. 2019-069584 filed on Apr. 1, 2019, and Japanese Patent Application No. 2020-35590 filed on Mar. 3, 2020, the content of which are incorporated herein by reference in their entirety.

TECHNICAL FIELD

Aspects of the disclosure relate to a piezoelectric actuator including two piezoelectric bodies laminated in a thickness direction of the piezoelectric actuator.

BACKGROUND

A known piezoelectric actuator includes a first common electrode, a first piezoelectric layer, an individual electrode, a second piezoelectric layer, and a second common electrode that are laminated together. The individual electrode is connected to a lead electrode. The lead electrode is electrically connected to the individual electrode.

SUMMARY

The first common electrode and the second common electrode are connected to each other at one side of the individual electrode. In this configuration, it may not be difficult to increase a contact area between the electrodes, so that a voltage drop may not be satisfactorily prevented or reduced.

Aspects of the disclosure provide a piezoelectric actuator that may prevent or reduce a voltage drop.

According to an aspect of the disclosure, a piezoelectric actuator comprises a first electrode, a first piezoelectric body disposed at one side of the first electrode in a thickness direction of the first electrode, an individual electrode disposed at one side of the first piezoelectric body in the thickness direction, a second piezoelectric body disposed at one side of the individual electrode in the thickness direction, a second electrode disposed at one side of the second piezoelectric body in the thickness direction, a wiring that electrically connects to the individual electrode, a first contact at which the first electrode and the second electrode electrically connect to each other, the first contact being disposed at one side of the individual electrode in a perpendicular direction perpendicular to the thickness direction, and a second contact at which the first electrode and the second electrode electrically connect to each other, the second contact being disposed at the other side of the individual electrode in the perpendicular direction.

According to another aspect of the disclosure, a piezoelectric actuator comprises a first electrode, a first individual electrode, a second electrode, a first piezoelectric body disposed between the first electrode and the first individual electrode, a second piezoelectric body disposed between the first individual electrode and the second electrode, a second individual electrode disposed between the first piezoelectric body and the second piezoelectric body, a first contact at which the first electrode and the second electrode electrically connect to each other, a second contact at which the first electrode and the second electrode electrically connect to each other, third contacts at which the first electrode and the second electrode electrically connect to each other, each of the third contacts electrically connecting to the second contact, and a fourth contact at which the first electrode and the second electrode electrically connect to each other, the fourth contact electrically connecting to both the first contact and the second contact. The first electrode, the first piezoelectric body, the first individual electrode, the second piezoelectric body, and the second electrode are stacked in a thickness direction. The first electrode, the first piezoelectric body, the second individual electrode, the second piezoelectric body, and the second electrode are stacked in the thickness direction. At least one portion of the first individual electrode and at least one portion of the second individual electrode are between the first contact and the second contact in a perpendicular direction perpendicular to the thickness direction. The first individual electrode and the second individual electrode are disposed between the third contacts in an arrangement direction that is perpendicular to the thickness direction and crosses the perpendicular direction. The third contacts are separated from both the first individual electrode and the second individual electrode. The fourth contact overlaps with both a portion of the first individual electrode and a portion of the second individual electrode in the thickness direction. The first contact has such a shape that tapers down in the perpendicular direction away from the second contact, so that a dimension, in the arrangement direction, of the first contact becomes smaller.

DETAILED DESCRIPTION

First illustrative Embodiment

Figure 1:
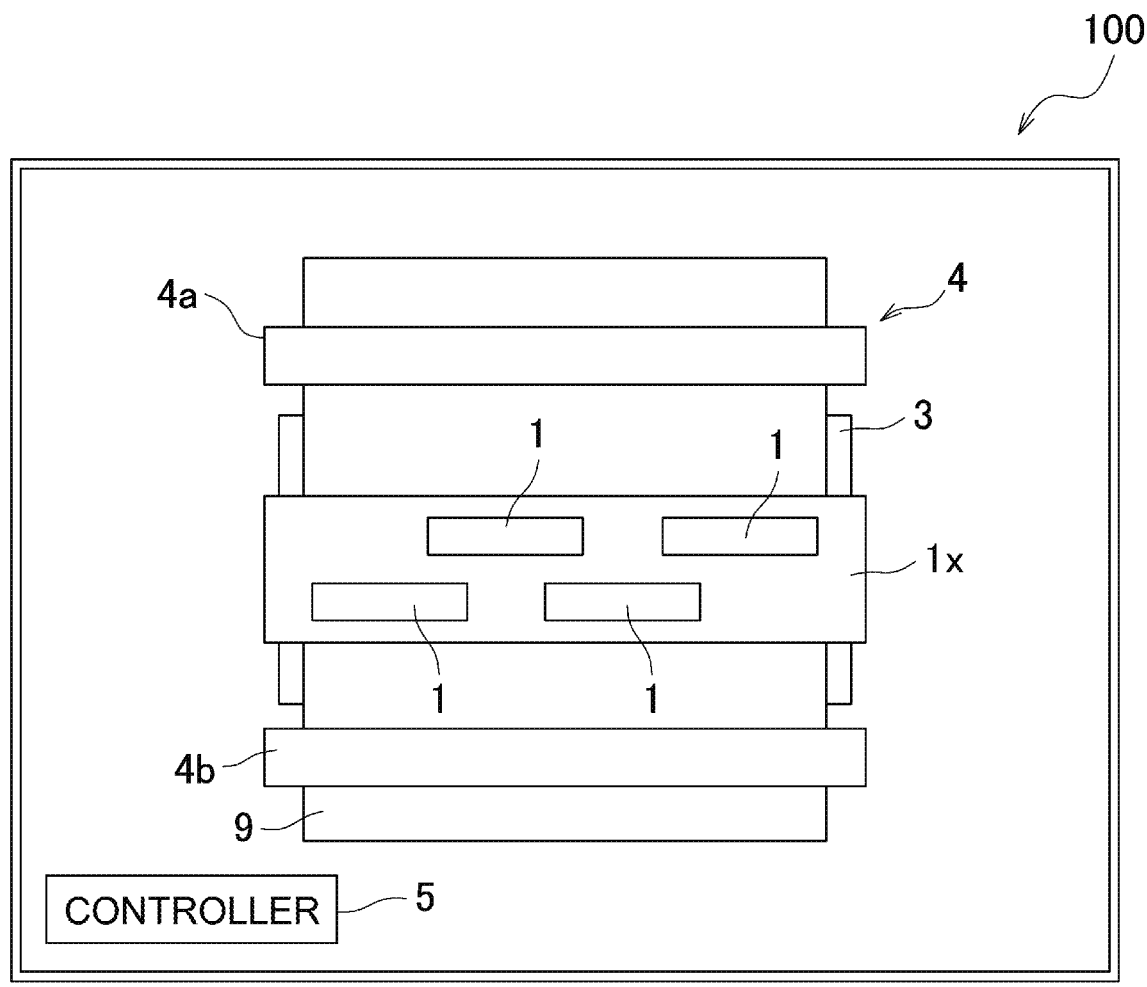
FIG. 1 is a plan view of a printer 100 including a head 1 that includes a piezoelectric actuator 30 in a first illustrative embodiment according to aspects of the disclosure.

Referring to FIG. 1, a configuration of a printer 100 including a piezoelectric actuator 30 according to a first illustrative embodiment of the disclosure will be described below.

The printer 100 includes a head unit 1x that includes four heads 1, a platen 3, a conveyance mechanism 4, and a controller 5.

The platen 3 has an upper surface configured to support a sheet 9.

The conveyance mechanism 4 has two roller pairs 4a and 4b disposed sandwiching the platen 3 in a conveyance direction. A conveyance motor (not depicted) is driven under the control of the controller 5. This may cause the roller pairs 4a and 4b to rotate while pinching the sheet 9, thereby conveying the sheet 9 in the conveyance direction.

The head unit 1x is longer in a sheet width direction, which is perpendicular to both of the conveyance direction and a vertical direction. The head unit 1x is of a line type, in which the head unit 1x at a fixed position ejects ink to the sheet 9 through nozzles 11 (refer to FIGS. 3 and 4). Each of the four heads 1 is longer in the sheet width direction. The four heads 1 are staggered in the sheet width direction.

The controller 5 includes a read only memory (ROM), a random access memory (RAM), and an application specific integrated circuit (ASIC). The ASIC performs processes, such as a recording process, in accordance with programs stored in the ROM. In the recording process, the controller 5 controls a driver IC (not depicted) in each head 1 and the conveyance motor (not depicted) in accordance with a recording command (including image data) input from an external device, such as a personal computer (PC), to record an image on the sheet 9.

Referring to FIGS. 2-5, a configuration of the head 1 will now be described.

The head 1 includes a channel substrate 10 and a piezoelectric actuator 30.

Figure 3:
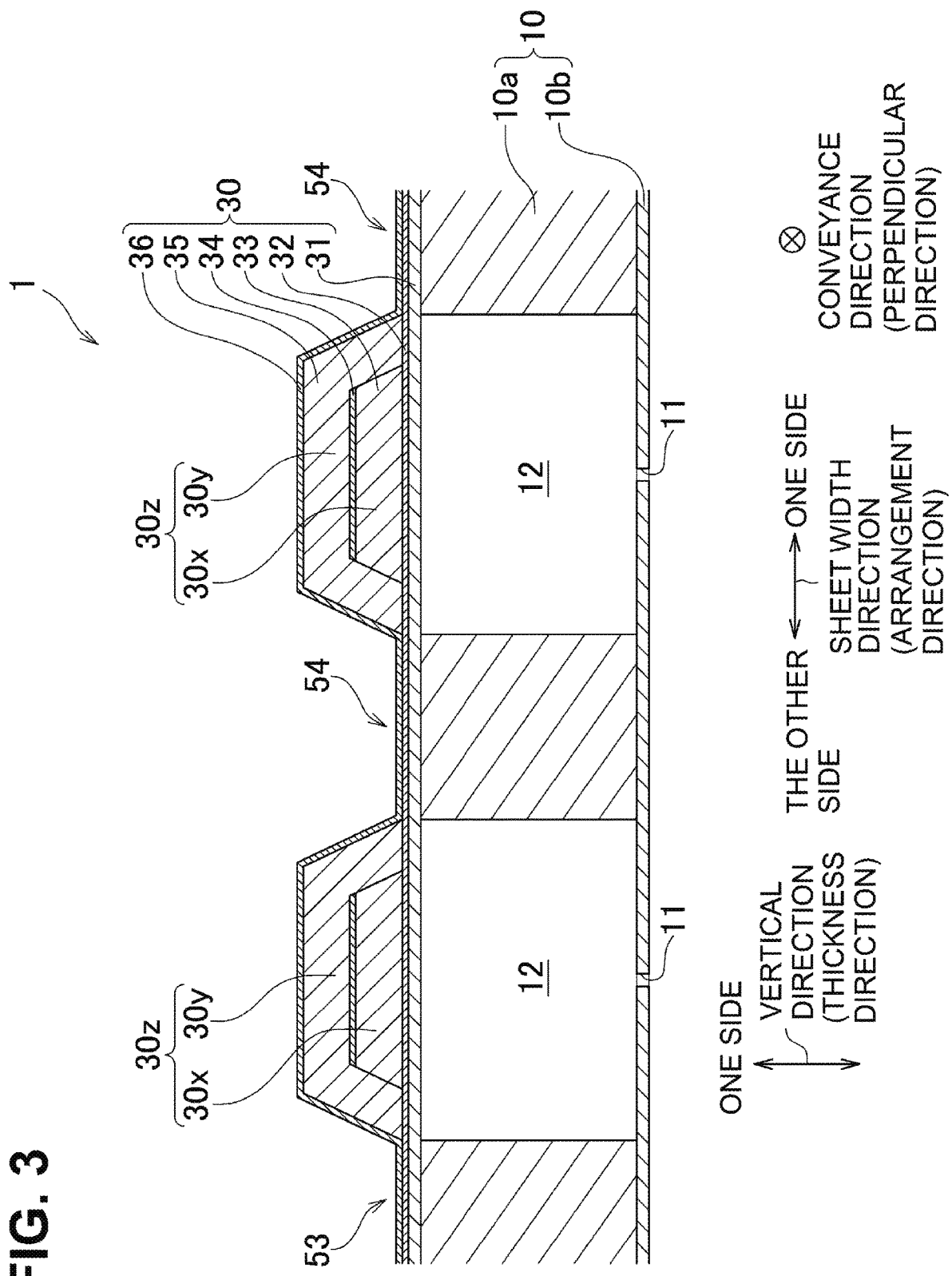
FIG. 3 is a cross-sectional view of the head 1 taken along a line in FIG. 2.
Figure 4:
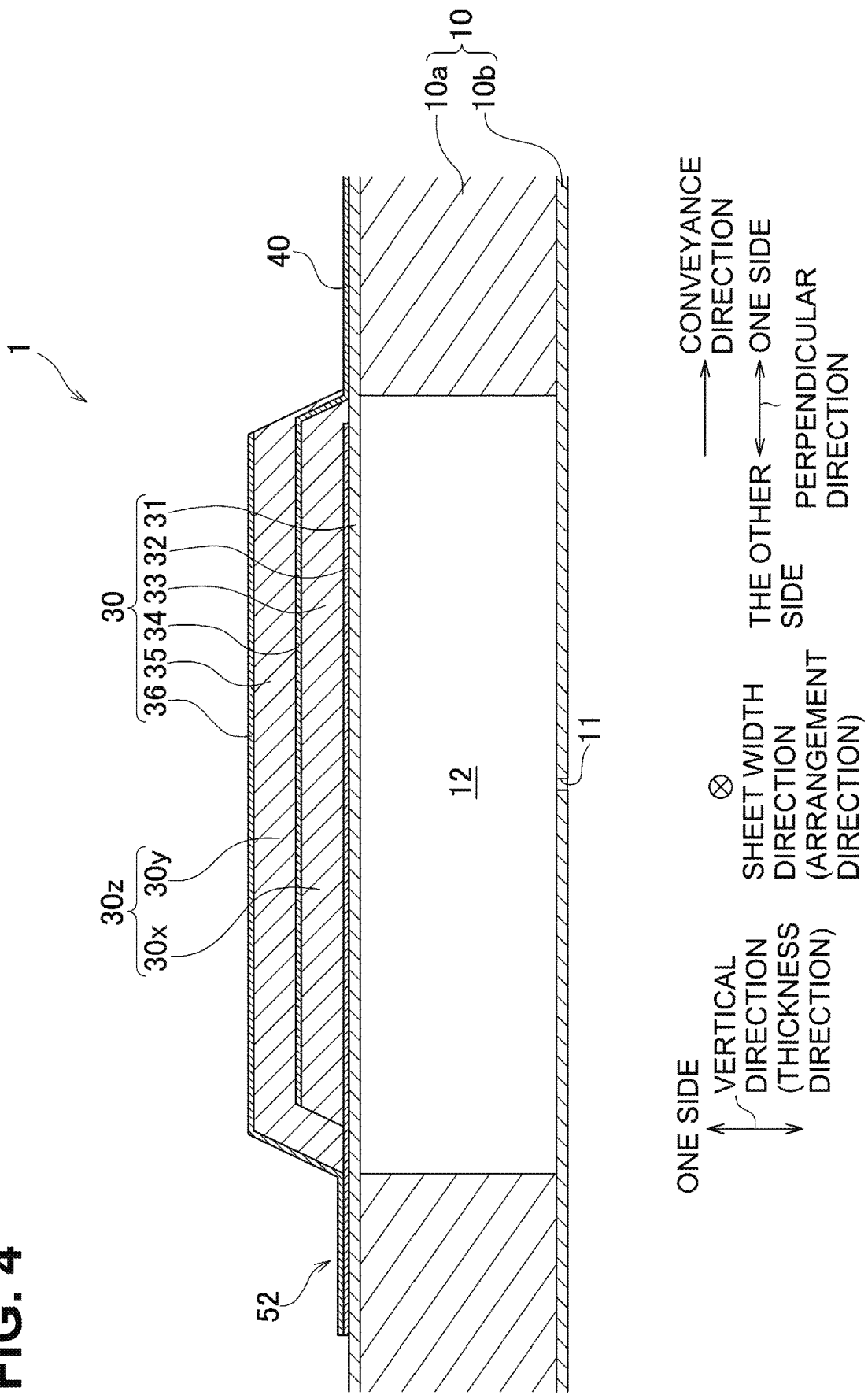
FIG. 4 is a cross-sectional view of the head 1 taken along a line IV-IV in FIG. 2.
Figure 5:
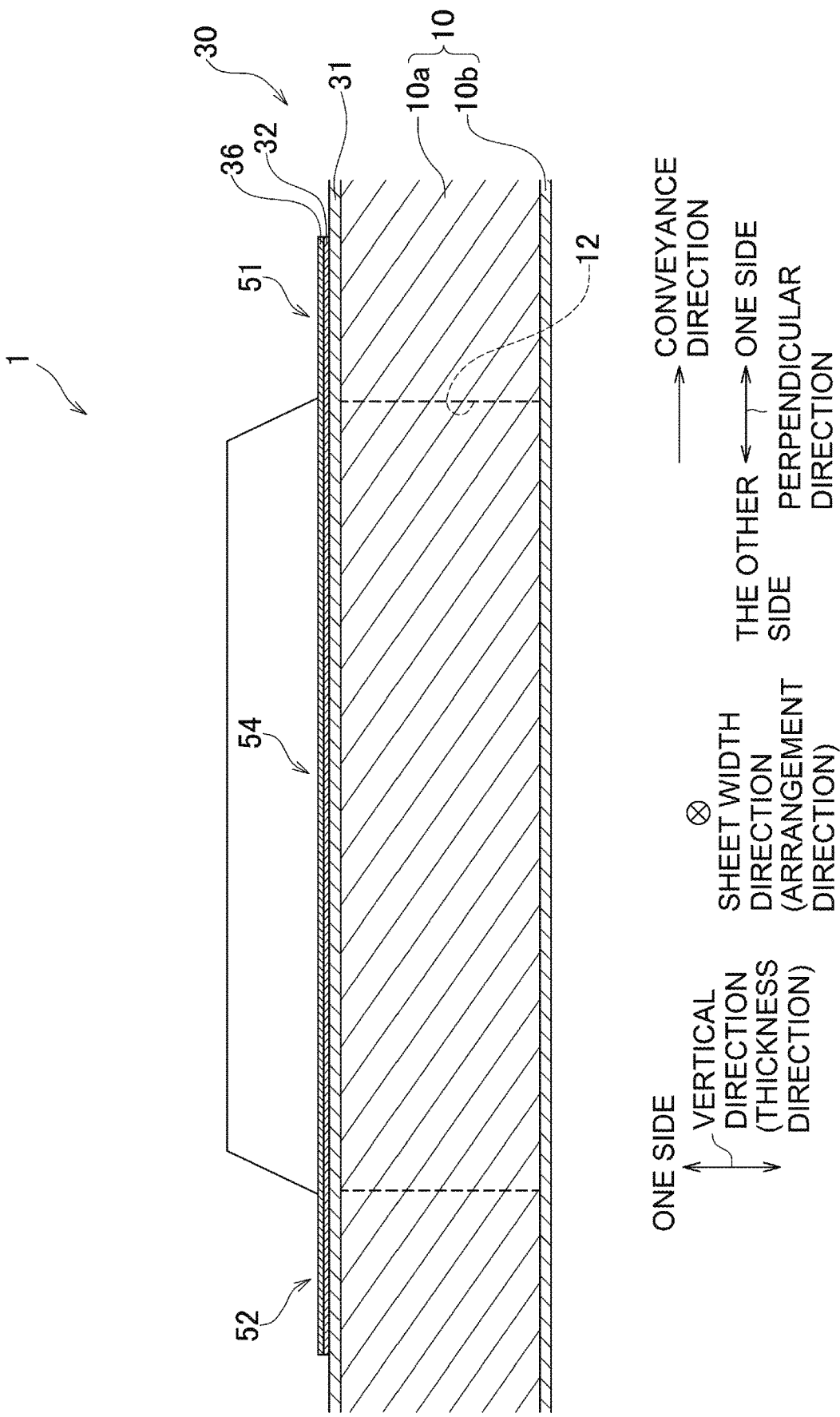
FIG. 5 is a cross-sectional view of the head 1 taken along a line V-V in FIG. 2.

As depicted in FIGS. 3 and 4, the channel substrate 10 includes two plates 10a and 10b, which are bonded to each other in the vertical direction (e.g., a thickness direction). The plate 10a has pressure chambers 12 formed therein. The plate 10b has the nozzles 11 formed therein.

Each of the nozzles 11 is provided in correspondence with a respective one of the pressure chambers 12. The nozzle 11 communicates with the pressure chamber 12.

Figure 2:
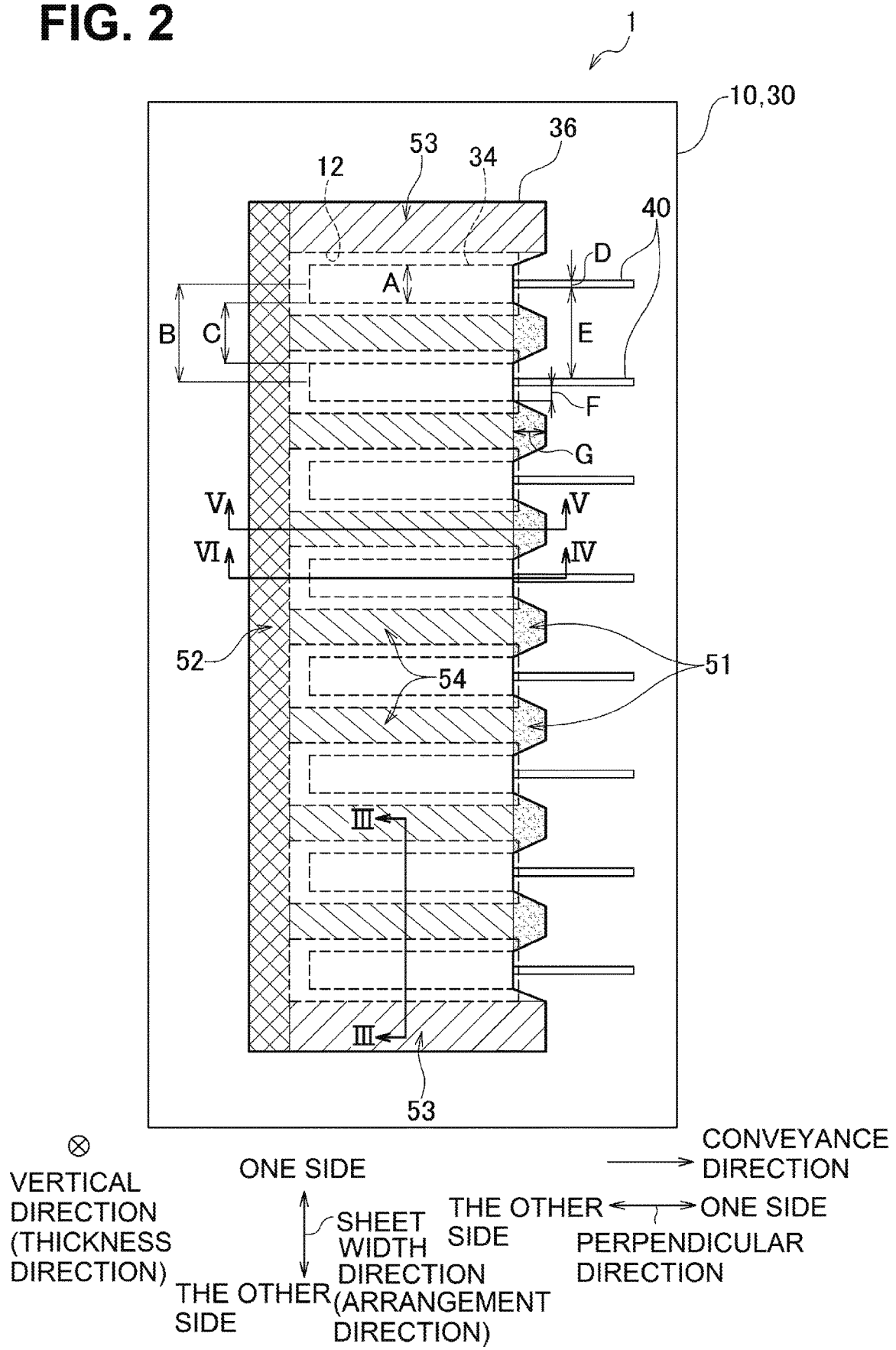
FIG. 2 is a top view of the head 1.

As depicted in FIG. 2, the pressure chambers 12 are arranged in a longitudinal direction of the head 1 (e.g., an arrangement direction), which corresponds to the sheet width direction. The pressure chamber 12 has a generally rectangular shape elongated in a width direction of the head 1 in a plan perpendicular to the thickness direction. The width direction of the head 1 corresponds to a direction parallel to the conveyance direction and may be referred to as a "perpendicular direction".

The pressure chamber 12 communicate with a supply channel (not depicted) that communicates with an ink tank (not depicted). Ink in the ink tank is supplied to the pressure chambers 12 through the supply channel The ink in the pressure chamber 12 is ejected from the corresponding nozzle 11 as the piezoelectric actuator 30 is deformed to change the volume of the pressure chamber 12 and apply pressures to the pressure chamber 12.

As depicted in FIGS. 3 and 4, the piezoelectric actuator 30 includes a diaphragm 31, a first common electrode 32 (e.g., a first electrode as claimed), first piezoelectric bodies 33, individual electrodes 34, second piezoelectric bodies 35, and a second common electrode 36 (e.g. a second electrode as claimed).

The diaphragm 31 is bonded to an upper surface of the plate 10a, covering all pressure chambers 12 formed in the plate 10a.

The first common electrode 32 is disposed on an upper surface of the diaphragm 31, and overlaps, in the thickness direction, with all pressure chambers 12 formed in the plate 10a. The first common electrode 32 has the same pattern as the second common electrode 36 as depicted in FIG. 2.

As depicted in FIG. 3, the first piezoelectric body 33, the individual electrode 34, and the second piezoelectric body 35 are provided in correspondence with the respective pressure chamber 12, and overlap with the pressure chamber 12 in the thickness direction. Laminated bodies, each including the first piezoelectric body 33, the individual electrode 34, and the second piezoelectric body 35, are arranged in the arrangement direction, similar to the pressure chambers 12.

The first piezoelectric body 33 is disposed on an upper surface of the first common electrode 32 above the first common electrode 32 (e.g., on one side in the thickness direction).

The individual electrode 34 is disposed on an upper surface of the first piezoelectric body 33 above the first piezoelectric body 33 (e.g., on one side in the thickness direction).

The second piezoelectric body 35 is disposed at an upper surface of the individual electrode 34 and side surfaces of the first piezoelectric body 33. The second piezoelectric body 35 includes a portion disposed above the individual electrode 34 (e.g., on one side in the thickness direction) and another portion overlapping with the first piezoelectric body 33 and the individual electrode 34 in a direction perpendicular to the thickness direction.

As depicted in FIG. 2, the second common electrode 36 has such a pattern that covers the first common electrode 32 and the second piezoelectric bodies 35 from above. The second common electrode 36 includes a portion disposed above the second piezoelectric body 35 (e.g., on one side in the thickness direction).

As depicted in FIG. 3, the piezoelectric actuator 30 includes actuators 30z in correspondence with the respective pressure chambers 12. Each of the actuators 30z includes a portion 30x that is a portion of the first piezoelectric body 33 sandwiched between the first common electrode 32 and the individual electrode 34 in the thickness direction, and another portion 30y that is a portion of the second piezoelectric body 35 sandwiched between the second common electrode 36 and the individual electrode 34 in the thickness direction.

As depicted in FIG. 2, the piezoelectric actuator 30 further includes wirings 40 that electrically connect to the respective individual electrodes 34. Each of the wirings 40 extends toward one side in the perpendicular direction from a central portion of an end surface of the individual electrode 34 parallel to the arrangement direction. The wiring 40 has a width (e.g., a dimension in the arrangement direction) that is smaller than the width of the individual electrode 34.

The common electrodes 32 and 36 are electrically connected with each other at first to fourth contacts 51-54 as depicted in FIG. 2. At the contacts 51-54, the common electrodes 32 and 36 overlap with each other in thickness direction, and contact with each other (refer to FIGS. 3-5).

The first contacts 51 are disposed at one side of the individual electrodes 34 in the perpendicular direction. In other words, an array of the first contacts 51 is disposed at one side of an array of the individual electrodes 34 in the perpendicular direction.

Each of the first contacts 51 is disposed at one side, in the perpendicular direction, of a region between the individual electrodes 34 adjacent to each other in the arrangement direction. The first contact 51 overlaps with the region in the perpendicular direction.

Each of the first contacts 51 extends across the region, in the arrangement direction, between two individual electrodes 34 adjacent to each other in the arrangement direction. In one example, the first contact 51 has a trapezoid shape in a plane perpendicular to the thickness direction. A longer base of the trapezoid extends across the region in the arrangement direction between the two adjacent individual electrodes 34. The trapezoid shape tapers down toward the one side in the perpendicular direction such that a width (e.g., a dimension in the arrangement direction) becomes shorter. In other words, the first contact 51 has such a shape that tapers down in the perpendicular direction away from the second contact 52, so that a dimension in the arrangement direction of the first contact 51 becomes smaller. The trapezoid shape is symmetrical with respect to a line extending in the perpendicular direction through the center of the first contact 51 in the arrangement direction.

The longer base of the first contact 51 has a width (e.g., a dimension in the arrangement direction) greater than the width (e.g., a dimension in the arrangement direction) of the wiring 40. The first contact 51 is spaced from the wiring 40 and does not overlap with the wiring 40 in the thickness direction.

The second contact 52 is disposed at the other side of the array of the individual electrodes 34 in the perpendicular direction. The second contact 52 is opposite to the array of the first contacts 51 in the perpendicular direction with respect to the array of the individual electrodes 34.

The second contact 52 has a rectangular shape elongated in the arrangement direction in a plane perpendicular to the thickness direction. The second contact 52 is longer in the arrangement direction than a region of the array of the individual electrodes 34. The second contact 52 protrudes, relative to the region of the array of the individual electrodes 34, toward the one side and the other side in the arrangement direction. The second contact 52 overlaps, in the perpendicular direction, with the individual electrodes 34, as well as regions between the individual electrodes 34.

The third contact 53 is disposed at the respective one side and the other side of the region of the array of the individual electrodes 34, in the arrangement direction.

The third contact 53 has a rectangular shape elongated in the perpendicular direction, in a plane perpendicular to the thickness direction. The third contact 53 is longer than the individual electrode 34 in the perpendicular direction. The third contact 53 protrudes, relative to the individual electrode 34, toward the one side and the other side in the perpendicular direction. The third contact 53 has a one-side end, in the perpendicular direction, that overlaps with the first contact 51 in the arrangement direction. The third contact 53 has an other-side end, in the perpendicular direction, that connects to the second contact 52. The third contact 53 overlaps with the individual electrodes 34 in the arrangement direction.

Each of the fourth contacts 54 is disposed between two individual electrodes 34 adjacent to each other in the arrangement direction.

The fourth contact 54 has a rectangular shape elongated in the perpendicular direction in a plane perpendicular to the thickness direction. The fourth contact 54 is longer than the individual electrode 34 in the perpendicular direction. The fourth contact 54 protrudes, relative to the individual electrode 34, toward the other side in the perpendicular direction. The fourth contact 54 has a one-side end, in the perpendicular direction, that connects to the first contact 51. The fourth contacts 54 has an other-side end, in the perpendicular direction, that connects to the second contact 52. The fourth contact 54 overlaps with the individual electrodes 34 in the arrangement direction.

In the above-described configuration, dimensions A-G as depicted in FIG. 2 are, for example, as given below.

The dimension A, which is a width/dimension of the pressure chamber 12 in the arrangement direction, may be 40-50 μm. The dimension B from the center of a pressure chamber 12 in the arrangement direction to the center of an adjacent pressure chamber 12 in the arrangement direction may be 80-90 μm. The dimension C between two adjacent pressure chambers 12 in the arrangement direction may be 40-50 μm. The dimension D, which is a width/dimension of the wiring 40 in the arrangement direction, may be 10-15 μm. The dimension E between two adjacent wirings 40 in the arrangement direction, may be 80-90 μm. The dimension F, which is a shortest distance between the wiring 40 and the first contact 51 in the arrangement direction, may be 5-10 μm. The dimension G of the first contact 51 in the perpendicular direction may be 40-80 μm.

As described above, in the illustrative embodiment, the common electrodes 32 and 36 are electrically connected to each other at both of the one side (e.g., the first contacts 51) and the other side (e.g., the second contact 52) of the individual electrodes 34 in the perpendicular direction (e.g., both of the one side toward which the wirings 40 extends and its opposite side) (refer to FIG. 2). As compared with a configuration in which the common electrodes 32 and 36 are electrically connected to each other only at the other side of the individual electrodes 34 in the perpendicular direction (e.g., at the second contact 52), the configuration of the first illustrative embodiment may increase portions of contacts. This may increase a contact area between the common electrodes 32 and 36 and prevent a voltage drop.

The first contact 51 does not overlap with the wiring 40 in the thickness direction (refer to FIG. 2). This configuration may not require a protective film, which may be required between the first contact 51 and the wiring 40, if they overlap with each other in the thickness direction, to prevent an electrical short-circuit. The illustrative embodiment may achieve a simple configuration and facilitate the manufacturing.

The width of the first contact 51 is greater than the width of the wiring 40 (refer to FIG. 2). This configuration may increase an area of the first contact 51 and reliably prevent a voltage drop.

The individual electrodes 34 are arranged in the arrangement direction. The wirings 40 extend from the respective individual electrodes 34 toward the one side in the perpendicular direction. The first contacts 51 are each disposed on the one side of the respective one of the individual electrodes 34 in the perpendicular direction (refer to FIG. 2). In a case where one first contact 51 would be provided for a plurality of individual electrodes 34, it would be difficult to dispose the wirings 40 without contacting the first contact 51. In contrast, in the illustrative embodiment, the first contact 51 is provided for a respective one of the individual electrodes 34, so that such an arrangement that the wirings 40 do not contact the first contacts 51 may be readily achieved.

The third contact 53 is disposed at least one of the one side and the other side of the region of the array of the individual electrodes 34 in the arrangement direction (e.g., in the illustrative embodiment, at both of the one side and the other side of the region in the arrangement direction) (refer to FIG. 2). This configuration may further increase an area of contact between the common electrodes 32 and 36 and reliably prevent a voltage drop.

Each of the fourth contacts 54 is disposed between two individual electrodes 34 adjacent to each other in the arrangement direction (refer to FIG. 2). This configuration may further increase an area of contact between the common electrodes 32 and 36 and reliably prevent a voltage drop.

The wiring 40 extends from an end of the individual electrode 34 parallel to the arrangement direction. The first contact 51 overlaps, in the perpendicular direction, with a region between the individual electrodes 34 adjacent to each other in the arrangement direction (refer to FIG. 2). This configuration may maintain an area for the first contact 51, while preventing an electrical short-circuit due to contact between the first contact 51 and the wiring 40, and prevent a voltage drop.

The first contact 51 extends across a region, in the arrangement direction, between two individual electrodes 34 adjacent to each other in the arrangement direction (refer to FIG. 2). This configuration may increase an area of the first contact 51 and reliably prevent a voltage drop.

The first contact 51 has such a shape that tapers down toward the one side in the perpendicular direction, so that a width (e.g., a dimension in the arrangement direction) of the first contact 51 becomes smaller (refer to FIG. 2). This configuration may effectively prevent an electrical short-circuit due to contact between the first contact 51 and the wiring 40.

The first contact 51 is symmetrical with respect to a line extending in the perpendicular direction through the center of the first contact 51 in the arrangement direction (refer to FIG. 2). This configuration may provide a space between the first contact 51 and the wiring 40 disposed on each side of the first contact 51 in the arrangement direction, and reliably prevent an electrical short-circuit due to contact between the first contact 51 and the wiring 40.

Second Illustrative Embodiment

Figure 6:
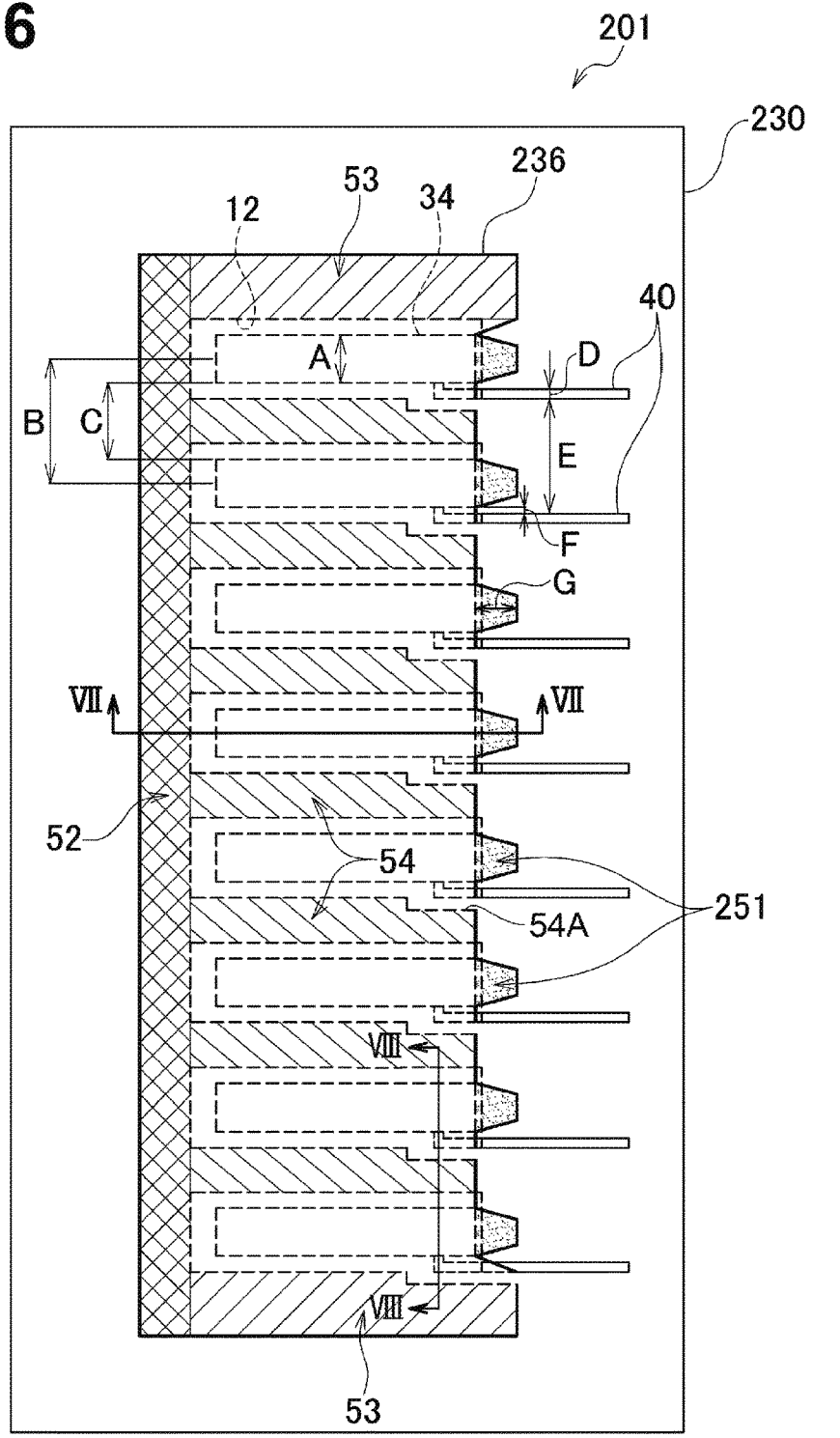
FIG. 6 is a top view of a head 201 including a piezoelectric actuator 230 in a second illustrative embodiment according to aspects of the disclosure.
Figure 7:
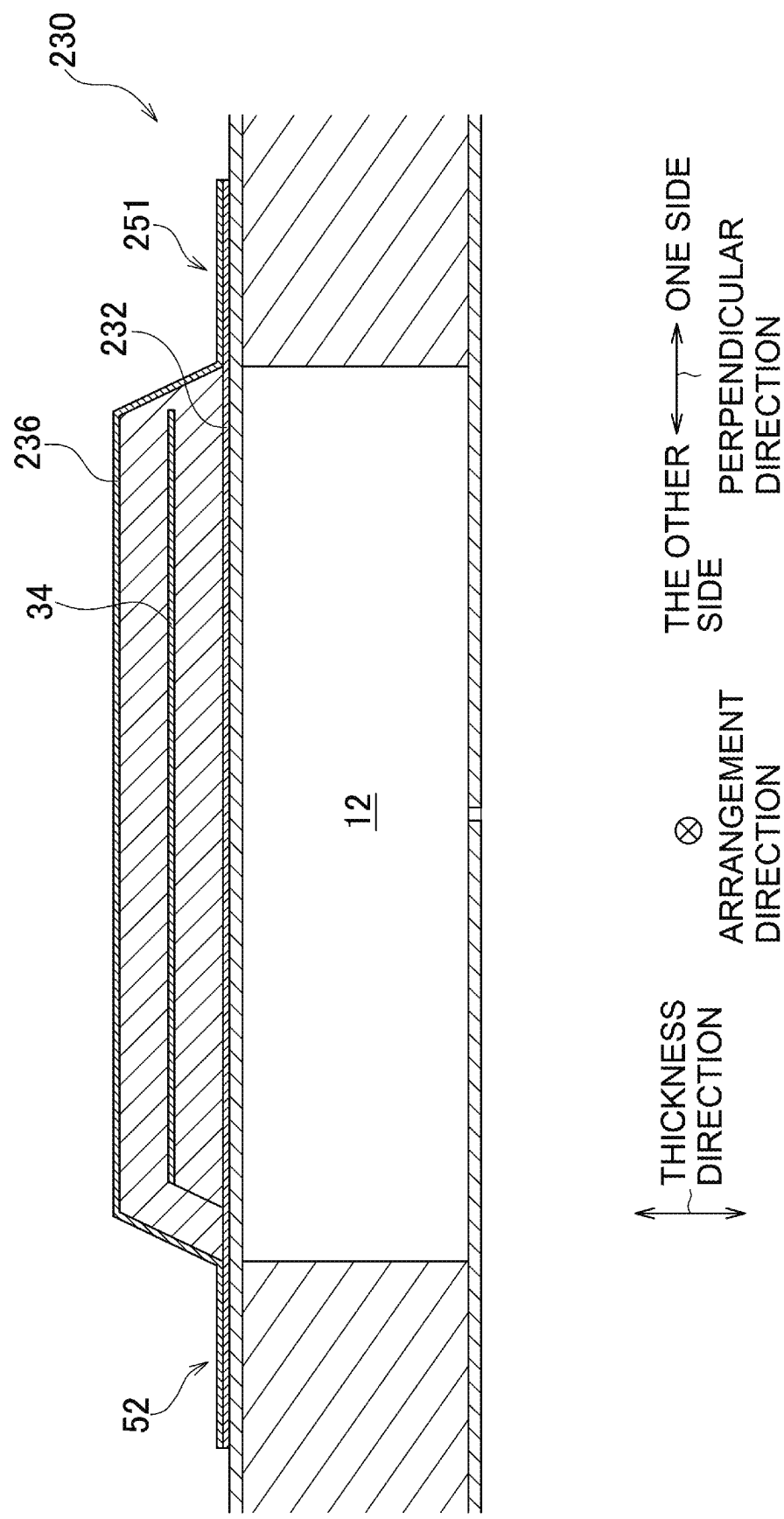
FIG. 7 is a cross-sectional view of the head 201 taken along a line VII-VII in FIG. 6.
Figure 8:
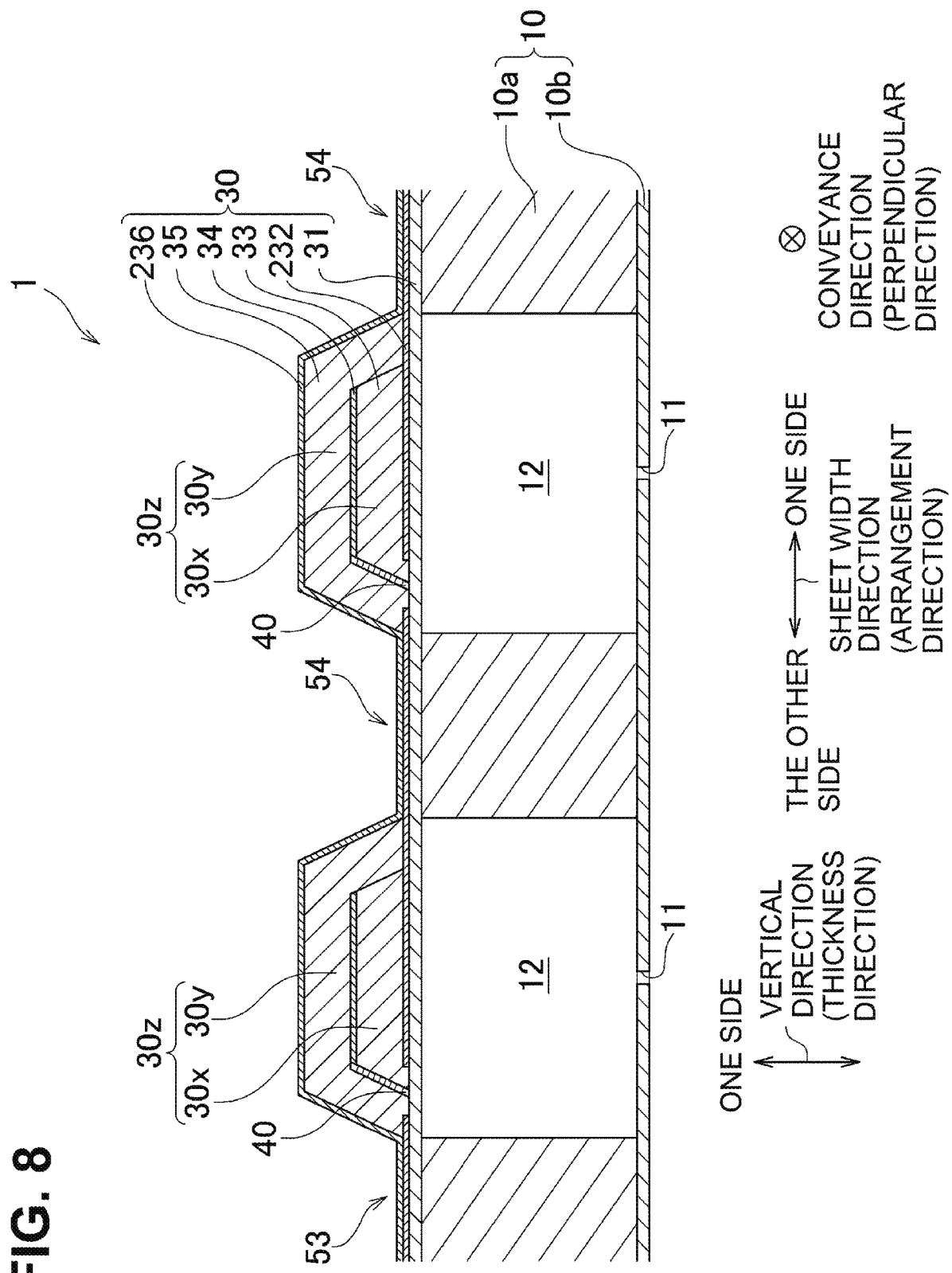
FIG. 8 is a cross-sectional view of the head 201 taken along a line VIII-VIII in FIG. 6.

Referring to FIGS. 6 through 8, a head 201 including a piezoelectric actuator 230 according to a second illustrative embodiment of the disclosure will be described below.

In the first illustrative embodiment (in FIG. 2), the wiring 40 extends toward the one side in the perpendicular direction from an end of the individual electrode 34 parallel to the arrangement direction. In the second illustrative embodiment (in FIG. 6), the wiring 40 extends toward the one side in the perpendicular direction from an end of the individual electrode 34 parallel to the perpendicular direction. As depicted in FIG. 6, the wiring 40 includes a first portion and a second portion. The first portion extends toward the other side in the arrangement direction from an other-side end of the individual electrode 34 in the arrangement direction. The other-side end of the individual electrode 34 in the arrangement direction is parallel to the perpendicular direction. The second portion extends toward the one side in the perpendicular direction from an end of the first portion.

In the second illustrative embodiment, a first common electrode 232 (e.g., the first electrode) has the same pattern as a second common electrode 236 (e.g., the second electrode), as depicted in FIG. 6. As depicted in FIG. 8, in the thickness direction, the first portion of the wiring 40 extends from the individual electrode 34 toward the diaphragm 31. The second portion of the wiring 40 is located at the same level as the first common electrode 232 in the thickness direction. The second portion of the wiring 40 is spaced from the first common electrode 232.

In the first illustrative embodiment (in FIG. 2), each first contact 51 overlaps, in the perpendicular direction, with a region between the individual electrodes 34 adjacent to each other in the arrangement direction. In the second illustrative embodiment (in FIG. 6), each first contact 251 overlaps, in the perpendicular direction, with a region of the respective individual electrode 34.

Each first contact 251 extends across a region (e.g., width) of a respective individual electrode 34 in the arrangement direction. In one example, the first contact 251 has a trapezoid shape in a plane perpendicular to the thickness direction. A longer base of the trapezoid extends across the region (e.g., the width) of the individual electrode 34 in the arrangement direction. The trapezoid shape tapers down toward the one side in the perpendicular direction such that a width (e.g., a dimension in the arrangement direction) of the first contact 251 becomes smaller. In other words, the first contact 251 has such a shape that tapers down in the perpendicular direction away from the second contact 52, so that a dimension in the arrangement direction of the first contact 251 becomes smaller. The trapezoid shape is symmetrical with respect to a line extending in the perpendicular direction through the center of the first contact 251 in the arrangement direction.

The longer base of the first contact 251 has a width (e.g., a dimension in the arrangement direction) that is greater than the width (e.g., a dimension in the arrangement direction) of the wiring 40. The first contact 251 is spaced from the wiring 40 and does not overlap with the wiring 40 in thickness direction.

Similar to the first illustrative embodiment, the second contact 52 in the second illustrative embodiment is disposed at the other side of the array of the individual electrodes 34 in the perpendicular direction. The third contact 53 is disposed at the respective one side and the other side of the region of the array of the individual electrodes 34, in the arrangement direction. Each of the fourth contacts 54 is disposed between two individual electrodes 34 adjacent to each other in the arrangement direction. Each fourth contact 54 has a step portion 54A unlike the first illustrative embodiment. The fourth contact 54 is spaced from the wiring 40 by the step portion 54A by a particular distance. The particular distance is greater than or equal to a shortest distance between the first contact 251 and the wiring 40.

In the second illustrative embodiment, dimensions A-G as depicted in FIG. 6 are the same as the dimensions A-G in the first illustrative embodiment, respectively.

As described above, in the second illustrative embodiment, the wiring 40 extends from an end of the individual electrode 34 parallel to the perpendicular direction. The first contact 251 overlaps, in the perpendicular direction, with the region (e.g., the width) of the individual electrode 34 (refer to FIG. 6). This configuration may maintain an area for the first contact 251, while preventing an electrical short-circuit due to contact between the first contact 251 and the wiring 40, and prevent a voltage drop.

Each of the first contacts 251 extends across a region (e.g., the width) of a respective one of the individual electrodes 34 in the arrangement direction (refer to FIG. 6). This configuration may increase an area of the first contact 251 and reliably prevent a voltage drop.

The first contact 251 has such a shape that tapers down toward the one side in the perpendicular direction, so that a width (e.g., a dimension in the arrangement direction) of the first contact 251 becomes smaller (refer to FIG. 6). This configuration may effectively prevent an electrical short-circuit due to contact between the first contact 251 and the wiring 40.

The first contact 251 is symmetrical with respect to a line extending in the perpendicular direction through the center of the first contact 251 in the arrangement direction (refer to FIG. 6). This configuration may provide a space between the first contact 251 and the wiring 40 disposed on each side of the first contact 251 in the arrangement direction, and reliably prevent an electrical short-circuit due to contact between the first contact 251 and the wiring 40.

Third Illustrative Embodiment

Figure 9:
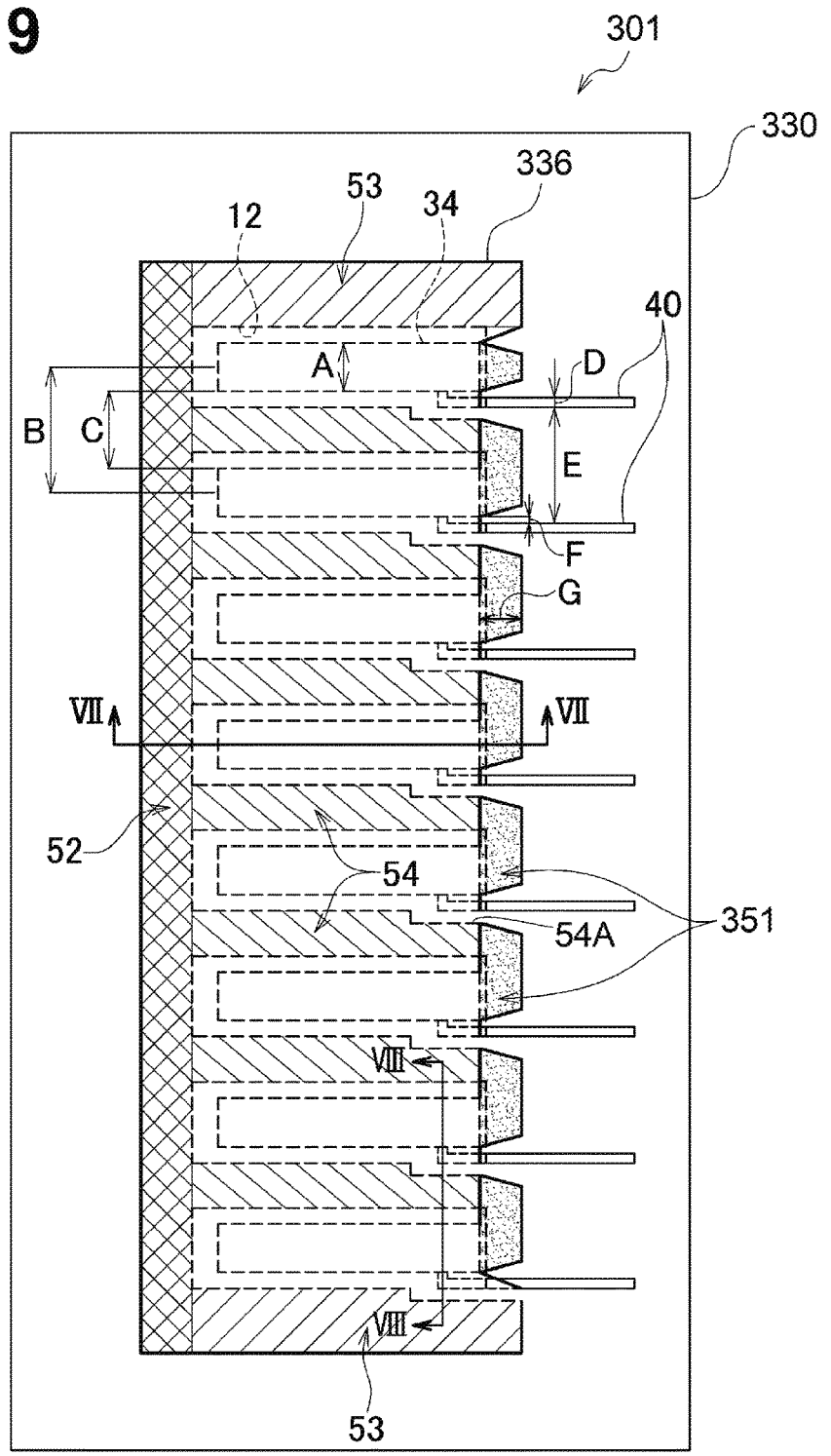
FIG. 9 is a top view of a head 301 including a piezoelectric actuator 330 in a third illustrative embodiment according to aspects of the disclosure.
Figure 10:
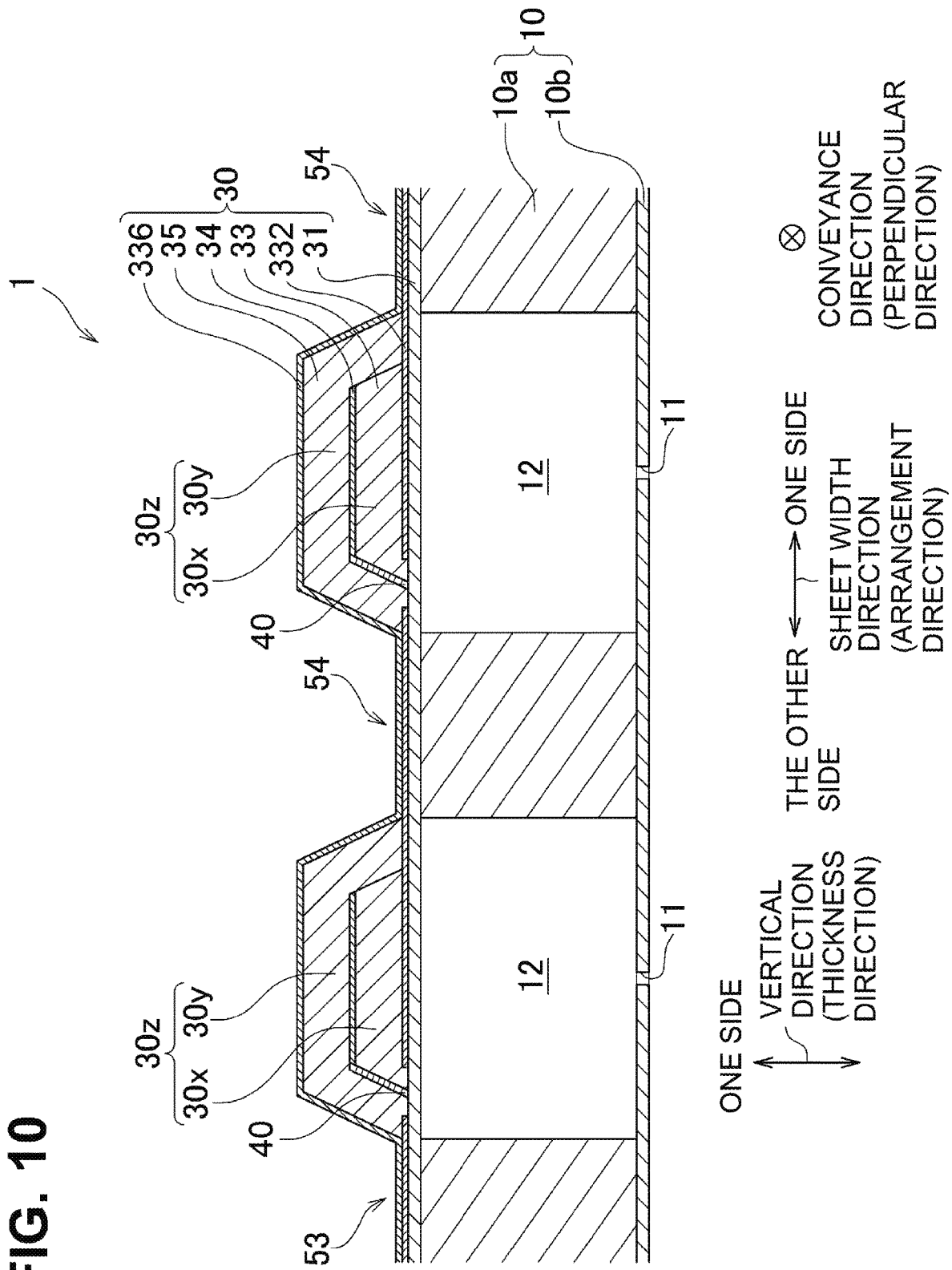
FIG. 10 is a cross-sectional view of the head 301 taken along a line VIII-VIII in FIG. 9.

Referring to FIGS. 9 and 10, a configuration of a head 301 including a piezoelectric actuator 330 according to a third illustrative embodiment of the disclosure will be described below.

In the third illustrative embodiment (in FIG. 9), a first contact 351 overlaps, in the perpendicular direction, with regions (e.g., widths) of the individual electrode 34 and the fourth contact 54, unlike the second illustrative embodiment (in FIG. 6) in which the first contact 251 overlaps, in the perpendicular direction, with the region of the individual electrode 34. The first contact 351 in the third illustrative embodiment (in FIG. 9) is longer in the arrangement direction than the first contact 251 in the second illustrative embodiment (in FIG. 6). The first contact 351 has a trapezoid shape in a plane perpendicular to the thickness direction. A longer base of the trapezoid extends across the regions (e.g., the widths) of the individual electrode 34 and the fourth contact 54 in the arrangement direction.

In the third illustrative embodiment, a first common electrode 332 (e.g., a first electrode) has the same pattern as a second common electrode 336 (e.g., a second electrode) as depicted in FIG. 9. Wirings 90 of the third illustrative embodiment as depicted in FIG. 9 have the same or similar configuration as the wirings 90 of the second illustrative embodiment as depicted in FIG. 6.

As described above, in the third illustrative embodiment (in FIG. 9), the first contact 351 overlaps, in the perpendicular direction, with the regions of the individual electrode 34 and the fourth contact 54. The first contact 351 of the third illustrative embodiment has a greater area than the first contact 251 of the second illustrative embodiment. This configuration may maintain an area for the first contact 351, and may reduce a voltage drop as compared with the configuration of the first contact 251.

Modifications

While aspects of the disclosure have been described in detail with reference to the specific embodiments thereof, various changes, arrangements and modifications may be applied therein as will be described below.

For example, the first contact may have a rectangular shape, a triangular shape, an oval shape or other shape, instead of the trapezoid shape. The first contact may be asymmetrical with respect to a line extending in the perpendicular direction through the center of the first contact in the arrangement direction.

The first contact according to the first illustrative embodiment may be partially provided at the region, in the arrangement direction, between the individual electrodes. The first contact according to the second illustrative embodiment may be partially provided at the region of the individual electrodes in the arrangement direction.

The first contact may have a width that is less than or equal to the width of the wiring.

For example, the first contact may have a wire or bar shape similar to the wiring. The first contact and the wiring may extend from an end of the individual electrode parallel to the arrangement direction and bend in a direction away from each other in the arrangement direction. Alternatively, the first contact may have a wire or bar shape similar to the wiring. The first contact may extend from the one-side end of the individual electrode in the arrangement direction (e.g., the one-side end parallel to the perpendicular direction). The wiring may extend from the other-side end of the individual electrode in the arrangement direction (e.g., the other-side end parallel to the perpendicular direction).

The first contact may overlap with the wiring in the thickness direction. In this configuration, a protective film may be provided between the first contact and the wiring.

One first contact may be provided for a plurality of the individual electrodes.

The piezoelectric actuator may include a plurality of second contacts, for example, such that the second contacts may be spaced from each other in the arrangement direction.

The third contact may be disposed at one of the one side and the other side of the region of the array of the individual electrodes in the arrangement direction.

The fourth contact may not be disposed at all portions between two individual electrodes adjacent to each other in the arrangement direction. For example, the fourth contact may be disposed at a portion between a group of the individual electrodes arranged in the arrangement direction and another group of the individual electrodes arranged in the arrangement direction. The fourth contact may not be disposed at a portion between the individual electrodes of the group.

The piezoelectric actuator may not necessarily include the third contact or the fourth contact.

Aspects of the disclosure may be applied to, for example, facsimile machines, copiers, and multi-functional devices other than printers. Aspects of the disclosure may be applied to a liquid ejection apparatus used for a purpose other than image recording (e.g., a liquid ejection apparatus that forms a conductive pattern by ejecting conductive liquid on a substrate). The piezoelectric actuator according to aspects of the disclosure may be applied to apparatuses other than a liquid ejection apparatus.

What is claimed is:

1. A piezoelectric actuator, comprising:
   a first electrode;
   a first piezoelectric body disposed at one side of the first electrode in a thickness direction of the first electrode;
   an individual electrode disposed at one side of the first piezoelectric body in the thickness direction;
   a second piezoelectric body disposed at one side of the individual electrode in the thickness direction;
   a second electrode disposed at one side of the second piezoelectric body in the thickness direction;
   a wiring that electrically connects to the individual electrode;
   a first contact at which the first electrode and the second electrode electrically connect to each other, the first contact being disposed at one side of the individual electrode in a perpendicular direction perpendicular to the thickness direction; and
   a second contact at which the first electrode and the second electrode electrically connect to each other, the second contact being disposed at the other side of the individual electrode in the perpendicular direction.

2. The piezoelectric actuator according to claim 1, wherein the first contact does not overlap with the wiring in the thickness direction.

3. The piezoelectric actuator according to claim 1, wherein the first contact has a width that is greater than a width of the wiring.

4. The piezoelectric actuator according to claim 1, wherein the individual electrode is included in an individual electrode array including a plurality of individual electrodes, and the first contact is included in a first contact electrode array including a plurality of first contacts, and wherein the first contact electrode array is disposed at one side of the individual electrode array in the perpendicular direction.

5. The piezoelectric actuator according to claim 1, wherein the individual electrode is included in an individual electrode array including a plurality of individual electrodes arranged in an arrangement direction that is perpendicular to the thickness direction and crosses the perpendicular direction, and wherein the piezoelectric actuator further comprises a third contact at which the first electrode and the second electrode electrically connect to each other, and the third contact is disposed at least one of one side and the other side of the individual electrode array in the arrangement direction.

6. The piezoelectric actuator according to claim 5, further comprising a fourth contact at which the first electrode and the second electrode electrically connect to each other, wherein the fourth contact is disposed between the individual electrodes adjacent to each other in the arrangement direction.

7. The piezoelectric actuator according to claim 1, wherein the individual electrode is included in an individual electrode array including a plurality of individual electrodes arranged in an arrangement direction that is perpendicular to the thickness direction and crosses the perpendicular direction, wherein the first contact is included in a first contact array including a plurality of first contacts, each of the plurality of first contacts among the first contact array overlaps, in the perpendicular direction, with a region between the individual electrodes adjacent to each other in the arrangement direction.

8. The piezoelectric actuator according to claim 1, wherein the individual electrode is included in an individual electrode array including a plurality of individual electrodes arranged in an arrangement direction that is perpendicular to the thickness direction and crosses the perpendicular direction, and wherein the first contact is included in a first contact array including a plurality of first contacts, each of the plurality of first contacts among the first contact array overlaps, in the perpendicular direction, with a region of the respective one of the individual electrodes.

9. The piezoelectric actuator according to claim 7, wherein each of the plurality of first contacts extends across the region in the arrangement direction.

10. The piezoelectric actuator according to claim 7, wherein each of the first contacts has such a shape that tapers down in the perpendicular direction away from the second contact, so that a dimension, in the arrangement direction, of a respective one of the first contacts becomes smaller.

11. The piezoelectric actuator according to claim 10, wherein the shape is symmetrical with respect to a line extending in the perpendicular direction through a center of the respective one of the first contacts in the arrangement direction.

12. The piezoelectric actuator according to claim 1, wherein the individual electrode is included in an individual electrode array including a plurality of individual electrodes, and the first contact is included in a first contact array including a plurality of first contacts, and wherein the first contact array is opposite to the second contact in the perpendicular direction with respect to the individual electrode array.

13. A piezoelectric actuator, comprising:
a first electrode;
a first individual electrode;
a second electrode;
a first piezoelectric body disposed between the first electrode and the first individual electrode;
a second piezoelectric body disposed between the first individual electrode and the second electrode;
a second individual electrode disposed between the first piezoelectric body and the second piezoelectric body;
a first contact at which the first electrode and the second electrode electrically connect to each other;
a second contact at which the first electrode and the second electrode electrically connect to each other;
third contacts at which the first electrode and the second electrode electrically connect to each other, each of the third contacts electrically connecting to the second contact; and
a fourth contact at which the first electrode and the second electrode electrically connect to each other, the fourth contact electrically connecting to both the first contact and the second contact;
wherein the first electrode, the first piezoelectric body, the first individual electrode, the second piezoelectric body, and the second electrode are stacked in a thickness direction,
wherein the first electrode, the first piezoelectric body, the second individual electrode, the second piezoelectric body, and the second electrode are stacked in the thickness direction,
wherein at least one portion of the first individual electrode and at least one portion of the second individual electrode are between the first contact and the second contact in a perpendicular direction perpendicular to the thickness direction,
wherein the first individual electrode and the second individual electrode are disposed between the third contacts in an arrangement direction that is perpendicular to the thickness direction and crosses the perpendicular direction,
wherein the third contacts are separated from both the first individual electrode and the second individual electrode,
wherein the fourth contact overlaps with both a portion of the first individual electrode and a portion of the second individual electrode in the thickness direction, and
wherein the first contact has such a shape that tapers down in the perpendicular direction away from the second contact, so that a dimension, in the arrangement direction, of the first contact becomes smaller.

* * * * *